United States Patent [19]

Kulju

[11] Patent Number: 5,073,706
[45] Date of Patent: Dec. 17, 1991

[54] PROCEDURE AND APPARATUS FOR DETECTING OBJECTS MOVING AT VARYING SPEEDS WITHIN A CERTAIN AREA

[75] Inventor: Hannu Kulju, Hyvinkaa, Finland

[73] Assignee: Kone Elevator GmbH, Baar, Switzerland

[21] Appl. No.: 284,640

[22] Filed: Dec. 15, 1988

[30] Foreign Application Priority Data

Dec. 18, 1987 [FI] Finland ............................... 875601

[51] Int. Cl.⁵ .......................................... G01V 9/04
[52] U.S. Cl. ................................ 250/221; 250/222.1; 340/555
[58] Field of Search ............ 250/214 AG, 221, 222.1; 340/555-557, 565, 567

[56] References Cited

U.S. PATENT DOCUMENTS

| | | | |
|---|---|---|---|
| 3,631,434 | 12/1971 | Schwartz | 250/221 |
| 3,703,718 | 11/1972 | Berman | 340/567 |
| 3,760,399 | 9/1973 | Schwarz | 340/567 |
| 3,781,842 | 12/1973 | Campman | 250/221 |
| 4,068,222 | 1/1978 | Treviranus | 340/556 |
| 4,179,691 | 12/1979 | Keller | 340/567 |
| 4,207,466 | 6/1980 | Drage et al. | 340/556 |
| 4,364,030 | 12/1982 | Rossin | 340/567 |
| 4,403,142 | 9/1983 | Kondo | 340/555 |
| 4,433,328 | 2/1984 | Saphir et al. | 340/555 |
| 4,520,343 | 5/1985 | Koh et al. | 187/105 |
| 4,612,442 | 9/1986 | Toshimichi | 250/353 |
| 4,645,919 | 2/1987 | McCaleb | 250/221 |
| 4,713,545 | 12/1987 | Norrgren et al. | 250/221 |

FOREIGN PATENT DOCUMENTS

| | | |
|---|---|---|
| 1043791 | 9/1966 | United Kingdom . |
| 1249302 | 10/1971 | United Kingdom . |
| 1335410 | 10/1973 | United Kingdom . |
| 1349050 | 3/1974 | United Kingdom . |
| 1391779 | 4/1975 | United Kingdom . |
| 1408078 | 10/1975 | United Kingdom . |
| 1551541 | 8/1979 | United Kingdom . |
| 1562283 | 3/1980 | United Kingdom . |
| 1588222 | 4/1981 | United Kingdom . |
| 1593608 | 7/1981 | United Kingdom . |
| 2191358 | 12/1987 | United Kingdom . |

Primary Examiner—David C. Nelms
Assistant Examiner—S. Allen
Attorney, Agent, or Firm—Sughrue, Mion, Zinn, Macpeak & Seas

[57] ABSTRACT

The invention relates to a procedure and apparatus for detecting and counting objects having velocities and that are in a certain area, wherein at least one passive detector detects background radiation, the signal obtained from said detector is amplified to produce a second signal independent of the distance and size of the object. The frequency content of this second signal is analyzed to chart the movements of the objects. To produce an inexpensive and simple detector, detection of movement of each object and generation of a signal with a frequency content are achieved by dividing the change in background radiation caused by each object into a succession of flashes hitting a surface capable of detecting the background radiation, so that the detector provides an electrical signal the frequency of which is characteristic of the velocity of each object and changes in proportion to the change in the velocity of each object.

7 Claims, 5 Drawing Sheets

PROCEDURE AND APPARATUS FOR DETECTING OBJECTS MOVING AT VARYING SPEEDS WITHIN A CERTAIN AREA

BACKGROUND OF THE INVENTION

1. Field of the Invention

The present invention relates to a procedure and apparatus for detecting and counting objects moving at varying speeds within a certain area in which the procedure employs at least one passive detector which detects background radiation.

2. Description of Related Art

The information derived from observing the movements of people or animals can be utilized in various applications. For instance, data obtained by monitoring the movements of people can be used to improve the ability of an elevator control system to quickly respond to different traffic conditions, such as peak traffic. In this case, on the basis of such data, it is possible e.g. to give certain floors a higher priority in the distribution of elevator services or to automatically activate an elevator call in certain circumstances. The movements of people and animals can be detected e.g. by using a Doppler radar, which operates in the microwave range.

In many applications it is preferable to use a simple and cheap passive detector working in the frequency range of either visible light or infrared radiation. Such a detector emits no radiation at all but detects objects on the basis of the signal generated in the detector by the visible light or thermal radiation generated or reflected by the objects.

A passive detector is most useful in cases where the microwave radar can not be used. These cases include applications in which the objects are at a very short distance from the detector, e.g. below 20 cm. Since the passive detector emits no radiation, no safety risks from radiation from the detector are involved and so clearance of the detector by, for example, governmental safety authorities is, at least on that point, substantially assured.

Finnish Patent 73090 presents a solution for counting moving objects, based on the Doppler radar technique. This solution makes use of modern filter banks and thus constitutes a simple and accurate system for counting objects within the operating range of the radars. There are other solutions using the radar technique, but the above-mentioned patent represents the top of the present state of the art.

The drawbacks with radars are the radiation generated and the fact that they can not detect objects at a very close distance. The latter difficulty arises from the limitations of the dynamic range of the radar. If the radar is adjusted for detection of objects within a short distance, then it can not detect farther away from it. Also, the radar always needs both a transmitter and a receiver, resulting in, for example, higher purchase price and installation costs, for the equipment.

There are several solutions for monitoring a given area which make use of harmless background radiation, e.g. visible light, but so far no reasonable solution has been discovered for the detection and counting of moving objects.

SUMMARY OF THE INVENTION

An objective of the present invention is to achieve a procedure and apparatus which is based on the passive detection of changes in radiation and is inexpensive to implement and constructed so that it can be used even in restricted spaces, e.g. close to a wall or in animal cages, to detect and count objects having velocities and that are in a certain area. To achieve that objective in the procedure of the invention a signal obtained from a detector is amplified to produce a second signal which is independent of the size and distance of such objects from the detector and the frequency content of that second signal is analyzed to detect and chart movement of the objects, and produce a third signal of frequency content. The change in background radiation caused by each object is divided into a succession of flashes hitting a surface capable of detecting the background radiation, so that the detector provides an electric signal of the frequency which is characteristic of the velocity of each object and changes in proportion to the change in the velocity of each object.

The apparatus for implementing the procedure of the invention, comprises at least one detector which passively detects background radiation, an automatic gain control unit, a plurality of narrow-band filters for identifying changes in the frequency of the detector signal and a counting logic for interpreting the detector signal, wherein the detector is provided with background radiation receiving means, said means being placed directly on or in front of the detector and provided with equispaced surficial discontinuity zones and differing from each other in respect of their penetrability by the background radiation.

Thus, the invention is based on the passive detection of radiation instead of the reflection of radiation generated by the device and reflected from objects as in radars. In the invention, the information as to the velocity of objects is also produced in a passive manner rather than electronically as in Doppler radars which continuously measure the frequency differences of the signals. The operation of the device receiving background radiation as provided by the invention could be compared to a Venetian blind which consists of alternate transparent and opaque zones in the vertical direction, the "flashes" caused by a moving object generating pulse trains in the detectors. These flashes, carrying information which is directly proportional to the velocity of the object, are thus produced passively with electronic processing only being applied to convert them into an electrical form.

If several detectors are used, more accurate results can be achieve than by using only one detector and the direction of movement of the objects can also be determined.

Other advantageous embodiments of the invention are characterized by what is presented in the claims to follow.

BRIEF DESCRIPTION OF THE DRAWINGS

Further objects, features and advantages of the invention will become apparent to those skilled in the art from the following description thereof when taken in conjunction with the accompanying drawings, in which.

DESCRIPTION OF THE PREFERRED EMBODIMENTS

Figure 1:
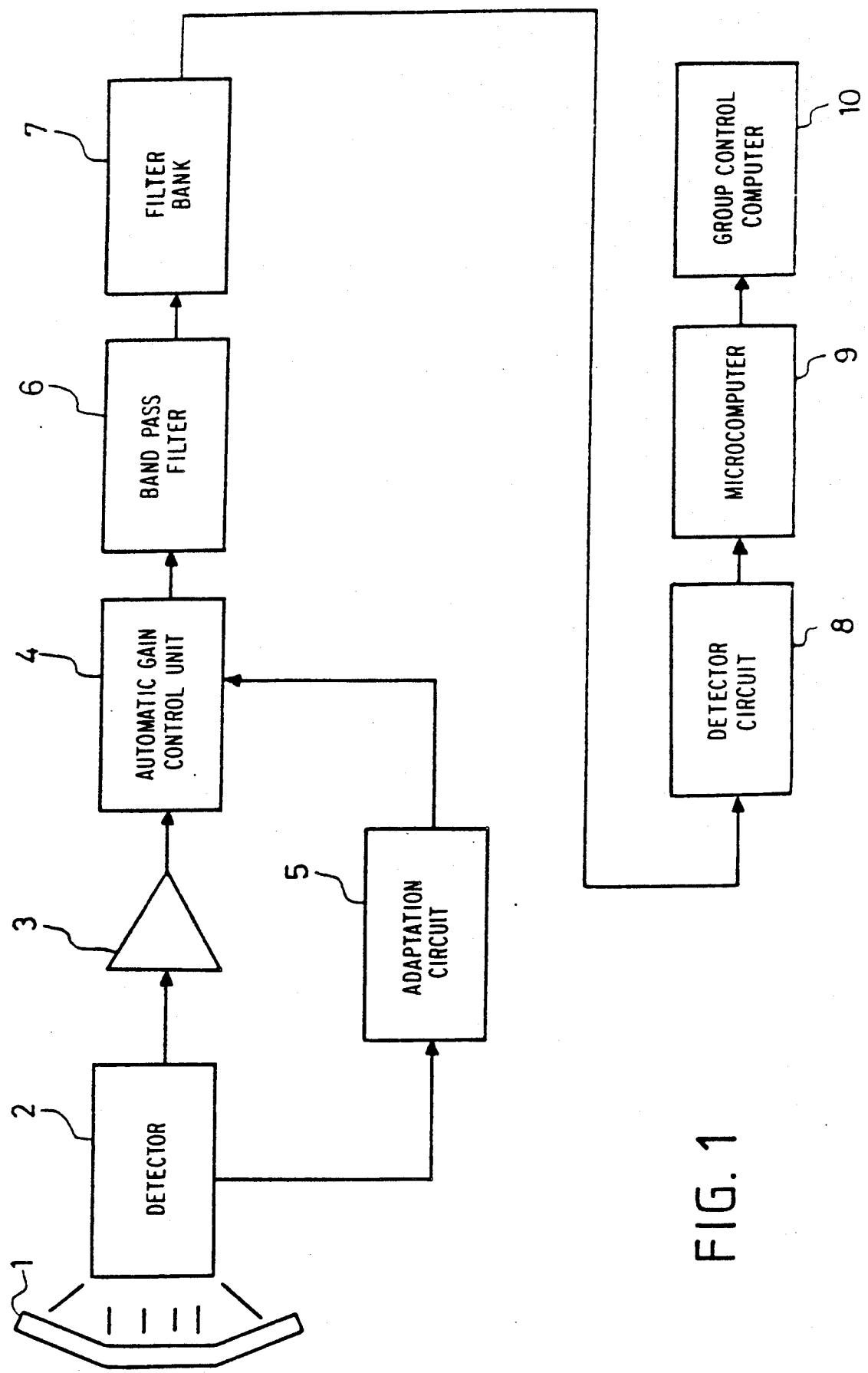
FIG. 1 is a block diagram representing the apparatus designed for implementing the procedure of the invention.
Figure 6:
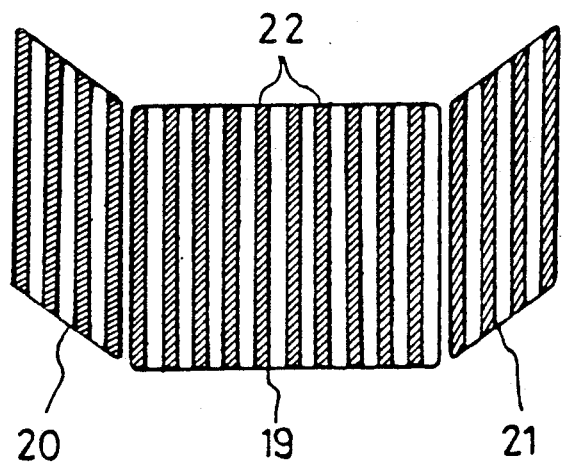
FIG. 6 shows an alternative for implementing a system of lenses as provided by the invention to direct passive background radiation onto a detector.

In the following example, an apparatus operating in the frequency range of visible or infrared light is used for monitoring the movements of people. In FIG. 1, the radiation reflected by an object travels to the detector 2 through a structure 1 of lenses or mirrors containing "holes" (FIG. 6). The structure 1 of lenses in this example may consist of one wide-angle lens or several smaller lenses mounted in the same frame. The structure 1 of lenses consists of alternate transparent and opaque zones, constituting a device for directing radiation to the surface of the detector 2. An example of such a structure 1 is a wide-angle lens having a suitable focal distance and provided with a mask consisting of vertical strips inhibiting the passage of light (FIG. 6). Another example of such a structure 1 is a lens provided with holes or areas from which the light is not deflected to the surface of the detector 2. When the object, e.g. a person in front of the elevator doors in a lobby, moves, a lens structure as described in this paragraph produces pulses of radiation on the detector surface from successive parts of the person's body and from people moving in succession.

To produce a signal which is independent of the size of the object and distance of the object from the detector, the signal obtained from the detector is amplified in an amplifier 3, from where it is passed to an automatic gain control (AGC) unit 4, whose operation and function, together with the adaptation circuit 5, are explained hereinafter in connection with FIG. 2. From the automatic gain control unit, the signal is passed via a band-pass filter 6 to a filter bank 7, where the signal is analyzed by means of a data bank consisting of a number of narrow-band filters. The band pass filter 6 prevents signals which change too slowly or too quickly from getting into the filter bank 7.

The filter bank divides the signal in the temporal plane into narrow frequency bands which, for an object moving at a constant velocity produce a frequency component characteristic of the velocity concerned, and for an object moving at a varying velocity, a series of frequency components characteristic of the velocity change concerned. From the filter bank 7, the signal is passed to a detector circuit 8, which counts the changes in the signal e.g. in the manner proposed in the Finnish patent 73090 referred to. The detector circuit 8 is so adjusted that each observation made by the detectors is attributed to a single object. Such attribution is not necessarily absolutely accurate but considering the ranges of operation and the circumstances in which the detectors are used, the assumption is adequate in most cases. A more accurate discrimination of the objects would involve a considerably more complicated apparatus.

The function of the microcomputer 9 placed after the detector circuit 8 is to analyze the significant occurrences on the basis of a predefined frequency distribution so as to identify the nature and number of movements of the objects. The movements may of course be either accelerating, decelerating or constant velocity movements, and the objects in the monitored area are counted in a cumulative manner, either adding to or substracting from the previous count, depending on whether the signal is interpreted as acceleration or deceleration. The microcomputer 9 transmits the count information thus gathered about the area to the group control computer 10.

Figure 2:
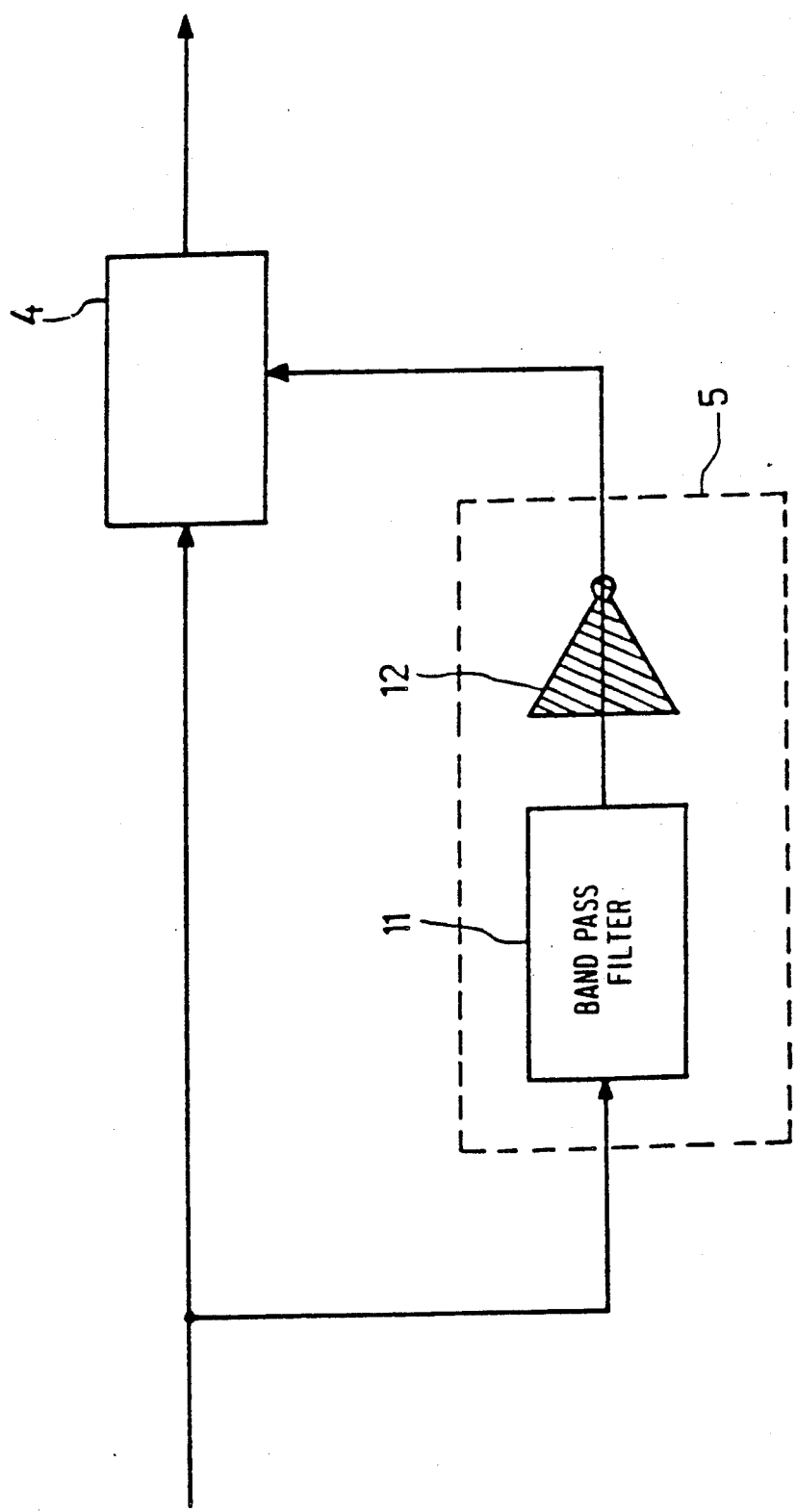
FIG. 2 is a block diagram representing the monitoring and correction of the automatic gain control to achieve a signal level which is independent of the distance and size of the object as well as the strength of background radiation.

FIG. 2 is a diagram showing the principle of the automatic gain control. The function of the unit is to adjust the input signal, in circumstances when there is a strong or disturbing background radiation, to a level which makes it independent of that background radiation. The background radiation may be e.g. thermal radiation emitted by a radiator. The band-pass filter 11 in the adaptation circuit 5 is tuned to the desired frequency range which has been found to be characteristic of the background radiation causing interference, so that the circuit detects the strength of the background radiation and adapts to the corresponding level. The automatic gain control unit 4 is controlled by the amplifier 12 in such manner that the strength of the background radiation, translated into a voltage level by the band-pass filter 11, always adjusts the sensitivity of the AGC to the maximum, i.e. sets its operating point, regardless of the prevailing conditions. In this way, the sensitivity of the automatic gain control is heightened when necessary, so that even slight changes in the input signal exceeding the background radiation can always be detected.

The invention allows reliable measurement of the movements of, for example, people and animals moving at different speeds. Information on the movements and stopping of people may be of interest in an elevator lobby or other space where the data provided by the detector can be utilized for the control of doors, lights, conveyors or escalators. Monitoring the movements of animals provides information which can be useful with regard to the management of feeding and other measures required. The invention can be applied e.g. to implement automatic control of a cattle farm, allowing an alarm to be activated if the animals move beyond certain boundaries.

Figure 3:
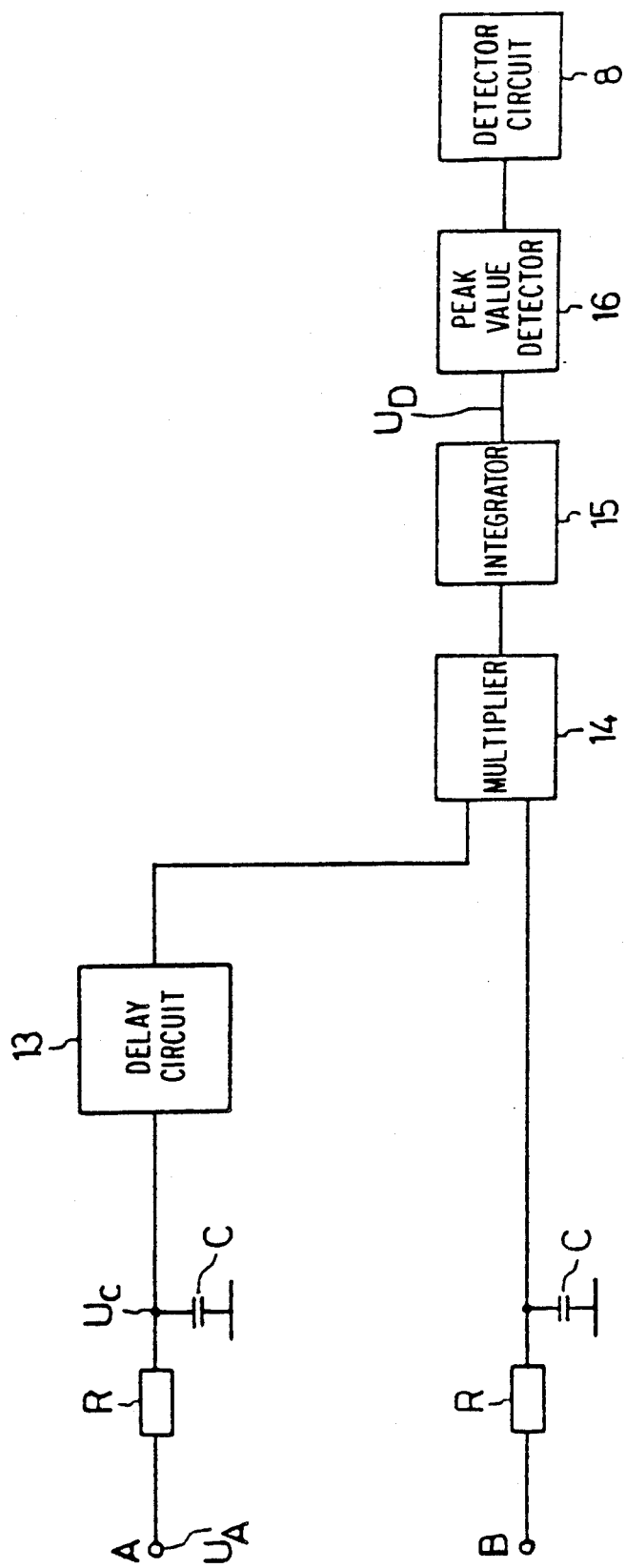
FIG. 3 shows how several passive detectors are connected together.

FIG. 3 shows how two detectors are coupled together. The input signals at terminals A and B are applied after the channel-specific detector devices presented in FIG. 1, i.e. from the filter bank 7, to pre-integration stages consisting of resistors R and capacitors C. The filter bank is implemented using either digital filters in the computer or conventional filters consisting of resistors and capacitors. In these, the rather indefinite pulse signal of varying frequency obtained from the filter bank 7 is processed so as to produce an even-edged pulse signal which, except for the basic frequency determined by C, has no other frequency components. Thus the result is a single pulse signal the frequency of which is still dependent on the velocity of the object detected.

The signal obtained from the filter banks can also be processed using frequency modulation if, e.g. for reasons of accuracy, the rather low detector frequencies are to be converted into higher frequencies.

A delay circuit 13 is used to ensure that the signals of the two channels are in phase when they arrive at the multiplier 14, because otherwise it would not be possible to achieve comparable values and a correlation with respect to the predefined values. This is effected by delaying the signal A of one of the channels by the necessary amount. The delay function could alternatively be incorporated in the multiplier 14, but for the sake of clarity it is presented here as a separate unit.

The data representing the "total movement" in front of the detector, gathered by the multiplier from the two channels, are fed into an integrator circuit 15 which integrates the pulses arriving within a certain constant time span to produce a rising triangular voltage signal, the changes of which are detected by a peak-value detector 16. If no changes have occurred within the area monitored, no pulses are supplied to the multiplier 14 and the integrator, which means that there is nothing to detect. If the peak value of the voltage signal rises within the defined time interval, this means that at least one new object has appeared in the monitored area, or that at least one of the objects previously detected has accelerated, which generates detection pulses in the detectors and a series of pulses in the filter banks 7 (FIG. 1), these pulses being generated at a continuously varying frequency as the object accelerates and moves further away, until the pulses suddenly disappear when the object reaches a distance beyond the range of the apparatus. If the object decelerates within the monitored area, a reverse process takes place and terminates when the object stops and the pulses cease to arrive.

The detector circuit 8 determines, from the changes in the peak values of the integrated signal based on the correlation between the peak values and reference values empirically determined in advance. The reference values are based on the detection of a single object, in the present example a person, in various situations within the area monitored. Thus, using a system like that in FIG. 3, the passive detectors placed in the elevator lobby in this example provide information on the movements of the people that are sources of radiation in different locations in the lobby. This information can be accumulated and translated via calculations into figures indicating, for example, how many people are waiting for an elevator at any given moment. The required calculations are performed by the microcomputer 9 in FIG. 1.

In this example, the group control system 10 is able to correct the information provided by the detector system, e.g. by setting the number of people to zero on the basis of information derived from other sources, e.g. from car position and loading etc.

Figure 4:
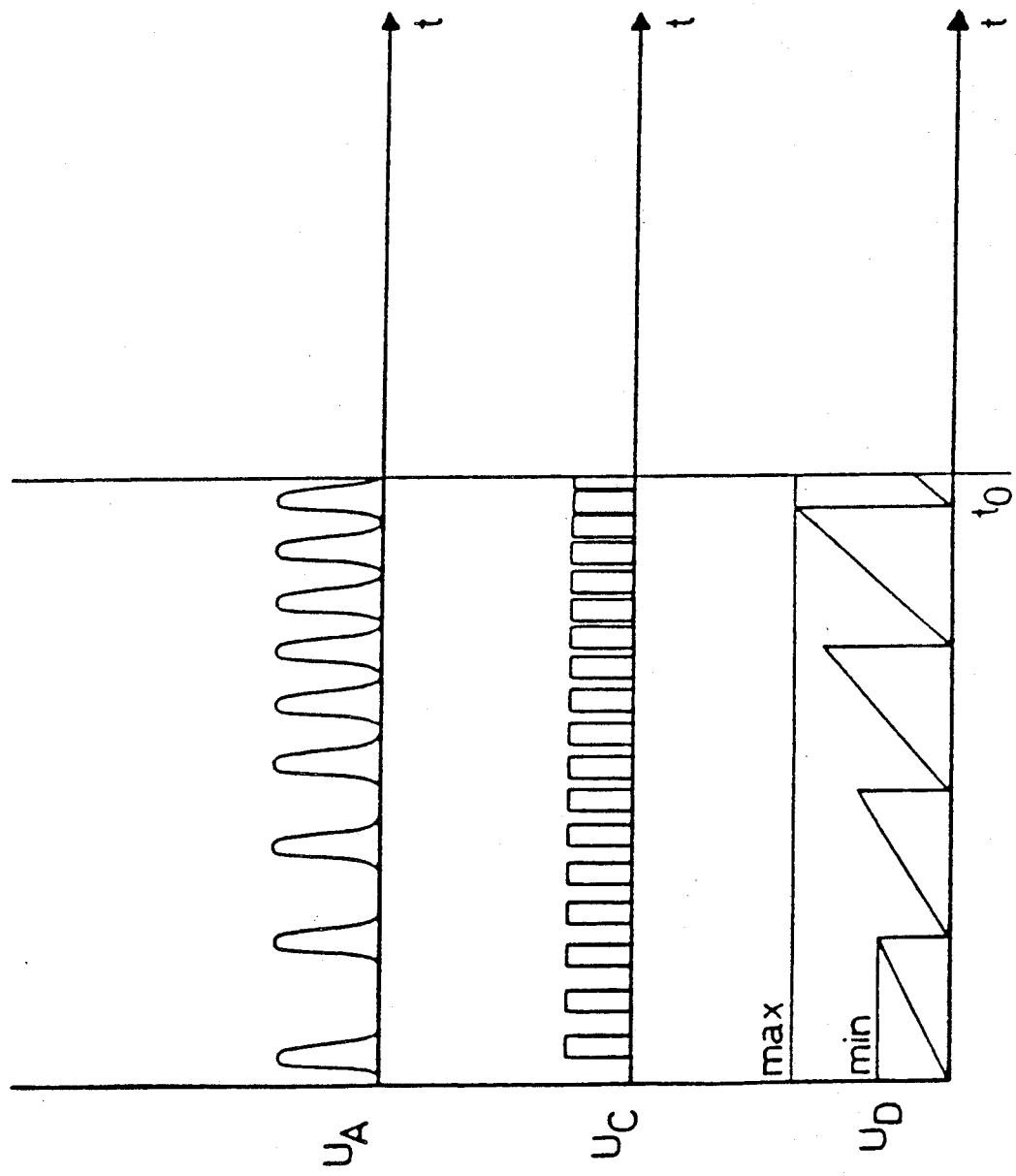
FIG. 4 shows the signal forms present in a circuit like that shown in FIG. 3.

FIG. 4 shows an example of the signal forms at different stages of the detection process. $U_A$ is the output signal obtained from one of the frequency bands of the filter bank 7 (FIG. 1), resulting e.g. from the detection of an object which is starting to move. The signal consists of pulses whose frequency increases with acceleration of the object, because the frequency component characteristic of the speed in question keeps changing as the frequency band in the filter bank changes in step with the change in the velocity, i.e. acceleration of the object. $U_C$ is a signal obtained after preliminary integration and consists of pulses the frequency of which is directly proportional to the frequency of the output signal of the filter bank 7. $U_D$ is the final signal obtained by integration and is fed into the peak-value detector 16. The function of the peak-value detector is to provide information on the peak values of the signal e.g. by storing two extreme values $U_{Dmin}$ and $U_{Dmax}$ occurring within a certain period $t_o$ and transmitting them to the detection logic, which can easily recognize the acceleration of the object on the basis of these data. A corresponding procedure is applied when the object decelerates, with the difference that the frequencies of $U_A$ and $U_C$ decrease from the initial value while the peak values of $U_D$ correspondingly fall.

Figure 5:
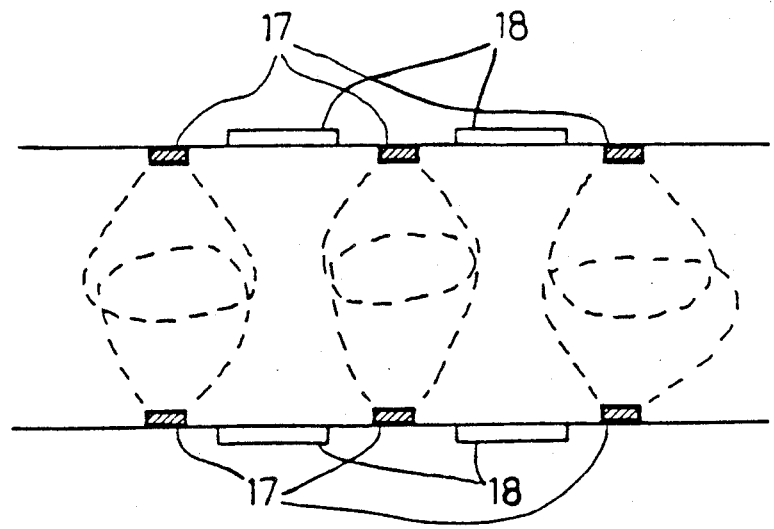
FIG. 5 shows how passive detectors can be placed in an elevator lobby.

FIG. 5 illustrates the principle of combining the velocity information obtained from several detectors, making use of correlations, to find a general speed distribution for a lobby as a whole, resulting from the movements of the people in that lobby. In this case, the information gathered by six detectors 17 about the movements of people waiting for four elevators 18 can be utilized by the elevator control system e.g. to activate peak-traffic control procedures or automatic floor calls, or it can be used simply to discover the presence of moving objects to enable an alarm to be activated via the elevator control system. The data can be transmitted from the detector system to the elevator control system through normal wired connections or by wireless transmission.

FIG. 6 represents an embodiment of the system of lenses for directing passive background radiation onto the detector surfaces. The lenses 19–21 may, for example, be made of plastic, of the "projector" type which is also used on the rear windows of motor vehicles. The lens surfaces are provided with vertical strips 22 impervious to the background radiation, said strips alternating with zones of normal lens surface. When an object moves past such a lens, the object's shadow produced by the background radiation advances across the successive strips, thus breaking the background radiation into a train of radiation pulses on the detector surface.

It will be obvious to a person skilled in the art that the scope of the invention is not restricted to the embodiments of the invention disclosed above but may instead be varied within the scope of the following claims without departing from the spirit and scope of the invention.

I claim:

1. A procedure for detecting and counting objects having velocities and that are in a certain area, wherein background radiation caused by each object is divided into a succession of flashes which hit a surface, said procedure comprising the steps of: detecting background radiation which impinges upon said surface with at least one passive detector and outputting a first electrical signal having a frequency that is characteristic of the velocity of each object and that changes in proportion to a change in the velocity of each object, amplifying said first signal obtained from said detector to produce a second signal which is independent of both the size of each object and the distance of each object from said detector, analyzing the frequency content of said second signal to detect and chart the movements of said objects, and producing a third signal having a frequency content indicative of the movement of each object.

2. A procedure according to claim 1, further comprising the step of: producing flashes of background radiation using radiation directing means having surficial discontinuity zones, said radiation detecting means being integral with or in front of said detector.

3. An apparatus for implementing the procedure of claim 1, comprising: at least one detector for passively detecting background radiation and outputting a detector signal, an automatic gain control unit, a plurality of narrow-band filters for identifying changes in the frequency of the detector signal, and counting logic means for interpreting the detector signal, wherein the detector is provided with background radiation receiving means, said means being placed directly on or in front of said detector and provided with equispaced surficial discontinuity zones and differing from each other in respect of their penetrability by said background radiation.

4. An apparatus according to claim 3, wherein said background radiation receiving means further comprises a radiation directing means having equispaced zones which neither reflect nor admit the radiation.

5. An apparatus according to claim 4, wherein said background radiation receiving means comprises one or more lenses provided with a plurality of equispaced vertical strips capable of inhibiting the passage of radiation.

6. An apparatus according to claim 4, wherein said background radiation receiving means comprises radiation directing means provided with a plurality of equispaced holes capable of inhibiting the passage of light.

7. An apparatus according to claim 3, wherein said background radiation receiving means comprises a polarizing optical device having alternate areas permeable and impermeable to said radiation and capable of being electrically controlled.

* * * * *